(12) United States Patent
Luk et al.

(10) Patent No.: US 7,805,658 B2
(45) Date of Patent: Sep. 28, 2010

(54) DRAM CACHE WITH ON-DEMAND RELOAD

(75) Inventors: Wing K. Luk, Chappaua, NY (US); Ravi Nair, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 899 days.

(21) Appl. No.: 11/673,657

(22) Filed: Feb. 12, 2007

(65) Prior Publication Data

US 2008/0195887 A1    Aug. 14, 2008

(51) Int. Cl.
   *G11C 29/00* (2006.01)
(52) U.S. Cl. ...................................... 714/766
(58) Field of Classification Search ............. 714/766
   See application file for complete search history.

(56) References Cited

U.S. PATENT DOCUMENTS

| | | | | |
|---|---|---|---|---|
| 5,638,385 A * | 6/1997 | Fifield et al. | .............. | 714/763 |
| 5,912,906 A * | 6/1999 | Wu et al. | ............. | 714/763 |
| 5,956,743 A * | 9/1999 | Bruce et al. | ............. | 711/103 |
| 6,108,753 A * | 8/2000 | Bossen et al. | ............. | 711/118 |
| 6,212,631 B1 * | 4/2001 | Springer et al. | ............. | 713/1 |
| 6,480,975 B1 * | 11/2002 | Arimilli et al. | ............. | 714/52 |
| 6,654,925 B1 * | 11/2003 | Meaney et al. | ............. | 714/763 |
| 6,868,484 B2 * | 3/2005 | Supnet | ............. | 711/133 |
| 6,870,749 B1 * | 3/2005 | Park et al. | ............. | 365/49.1 |
| 7,027,326 B2 | 4/2006 | Luk et al. | | |
| 7,120,836 B1 * | 10/2006 | Englin et al. | ............. | 714/53 |
| 7,177,986 B2 * | 2/2007 | Rowlands et al. | ............. | 711/144 |
| 7,272,773 B2 * | 9/2007 | Cargnoni et al. | ............. | 714/763 |
| 7,337,352 B2 * | 2/2008 | DeSota | ............. | 714/6 |
| 7,392,347 B2 * | 6/2008 | Briggs | ............. | 711/129 |
| 7,437,597 B1 * | 10/2008 | Kruckemyer et al. | ............. | 714/6 |
| 7,437,651 B2 * | 10/2008 | Nerl et al. | ............. | 714/767 |
| 2005/0128803 A1 | 6/2005 | Luk et al. | | |

* cited by examiner

*Primary Examiner*—Stephen M Baker
(74) *Attorney, Agent, or Firm*—Cantor Colburn LLP; Brian Verminski

(57) ABSTRACT

Embodiments include a DRAM cache structure, associated circuits and method of operations suitable for use with high-speed caches. The DRAM caches do not require regular refresh of its data and hence the refresh blank-out period and refresh power are eliminated, thus improving cache availability and reducing power compared to conventional DRAM caches. Compared to existing SRAM caches, the new cache structures can potentially achieve the same (or better) speed, lower power and better tolerance to chip process variations in future process technologies.

17 Claims, 18 Drawing Sheets

DRAM Cache With Refresh Engine
Prior Art

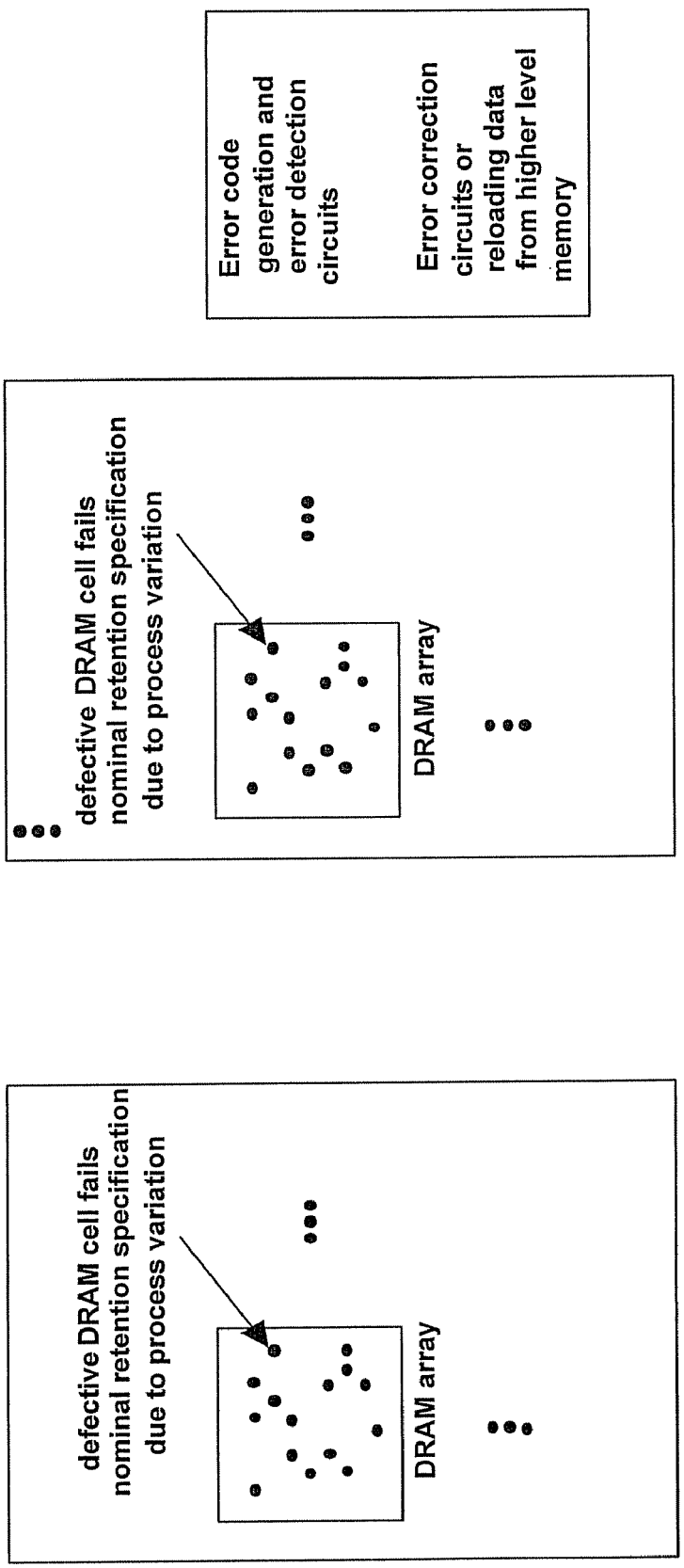

DRAM CACHE WITH ON-DEMAND RELOAD

CROSS-REFERENCE TO RELATED APPLICATIONS

This application contains subject matter, which is related to the subject matter of the following co-pending applications, each of which is assigned to the same assignee as this application, International Business Machines Corporation of Armonk, N.Y. Each of the below listed applications is hereby incorporated herein by reference in its entirety:

entitled "Gated Diode Memory Cells", Ser. No. 10/735,061, filed Dec. 11, 2003; and entitled "3T1D Memory Cells Using Gated Diodes And Methods Of Use Thereof", U.S. Pat. No. 7,027,326, issued Apr. 11, 2006.

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to a novel DRAM cache structure, the associated circuits and method of operations suitable for high-speed caches, such as write-through caches.

2. Description of Background

Before our invention conventional caches (such as level '1', '2') embedded in high-speed processors are made up of static random access memory (SRAM) for high speed and refresh-free operations. Refresh-free is important as refresh operations required for dynamic random access memory (DRAM) reduces read availability and hence reduces system performance. This is especially crucial for level '1' (L1) and level '2' (L2) caches since they are closest to the execution unit and must have a relatively short latency, so adding a refresh cycle could contribute a relatively large performance penalty. With the recent advent of DRAM cells with gated diode (such as the 2T1D, 3T1D) DRAM speeds are now comparable to that of conventional SRAM. Further, they are better in low voltage scaling, and are more tolerant to various process variations, addressing the voltage scaling issue and variability issues facing SRAM for future generations of technologies. The remaining major hurdle for these DRAM's is the ability to reduce or hide refresh cycles, so as to minimize read and write stalls. Usually, with proper scheduling of write operations and buffering of write data, stalls can be minimized. For read operations in low latency DRAM caches, the refresh cycles would potentially lead to read stalls and higher miss rates (lower performance). Further, a significant amount of power is required to refresh the DRAM cells. The refresh circuits needed for a DRAM cache add complexity, have architecture and performance impacts, and require architectural changes for replacing SRAM with DRAM in the caches of conventional processors.

There is a long felt need for a novel DRAM cache structure for high speed, low-level caches that does not require refresh operations. Such a structure must also incorporate mechanisms for the detection of multi-bit errors resulting from the alteration of stored charges in the DRAM cells due either to leakage (retention error) or to radiation events (soft error). This in part gives rise to the present invention.

SUMMARY OF THE INVENTION

The shortcomings of the prior art are overcome and additional advantages are provided through the provision of a DRAM cache with on-demand reload, the DRAM cache comprising: a plurality of DRAM arrays, each of the plurality of DRAM arrays further comprising a plurality of DRAM cells; a plurality of sense amplifiers; an input output structure used for a plurality of data; and a plurality of static and radiation hardened memory cells utilized as error check bits, for associated the plurality of sense amplifiers, and or for the input output structure.

System and computer program products corresponding to the above-summarized methods are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution which is a DRAM cache that does not require regular refresh of its data, hence the refresh blank-out period and refresh power are eliminated, hence improving cache availability and reducing power compared to conventional DRAM caches.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

FIGS. 13A and 13B illustrate an error detection and correction scheme to improve DRAM chip yield The detailed description explains the preferred embodiments of the invention, together with advantages and features, by way of example with reference to the drawings.

DETAILED DESCRIPTION OF THE INVENTION

Turning now to the drawings in greater detail, based on observing the temporal behavior of data in level '1' data caches for various type of (benchmark) codes, a high percent of data in level '1' data caches does not remain in the cache beyond certain number of processor cycles. This number when translated into actual time (by multiplying with the cycle time of the processor) is well within the retention time that can be achieved by proper design (tradeoff) of high speed DRAMs. The underlying phenomenon that is being taken advantage of here is that data in lower level caches are either updated often, in which case they are automatically refreshed, or are usually cast out to make space for new data before the end of the retention life of the original data.

As such, here is presented a novel DRAM cache structure, the associated circuits and method of operations suitable for high-speed caches, such as write-through caches. The DRAM caches do not require regular refresh of its data, hence the refresh blank-out period and refresh power are eliminated, hence improving cache availability and reducing power compared to conventional DRAM caches. Compared to existing SRAM caches, the new cache structures can potentially achieve the same (or better) speed, lower power and better tolerance to chip process variations for future generations of process technology. Detection of multi-bit (soft) errors in caches and memory is becoming more important due to scaling of device size for future technologies. Hence various schemes for error detection for data in the proposed DRAM cache are also presented for detecting errors due to leakage (retention error) and radiation (soft error).

Figure 1C:
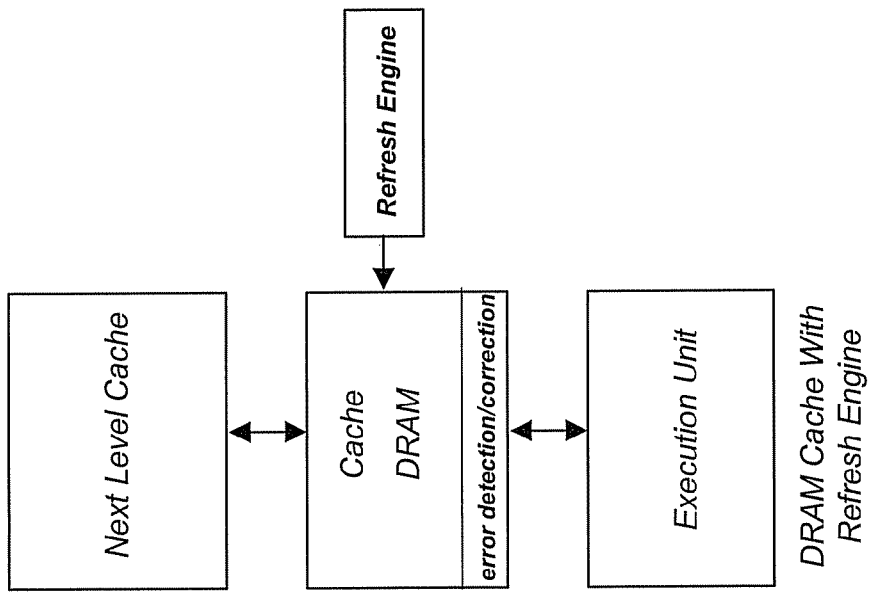
FIGS. 1A-1C illustrate examples of conventional caches with SRAM and DRAM.
Figure 1B:
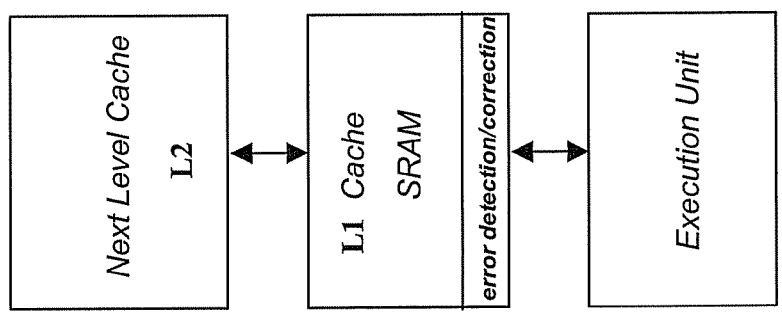
Figure 1A:
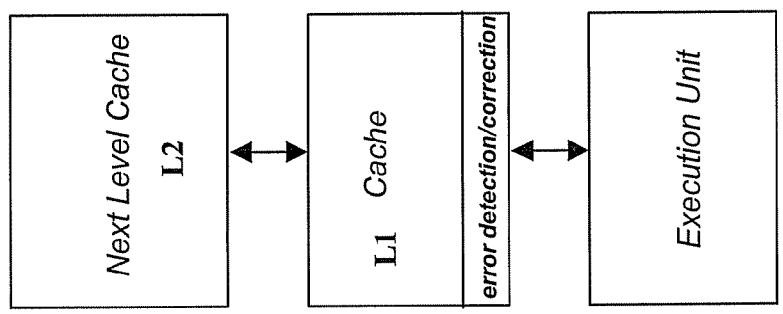

FIGS. 1A-1C illustrate examples of caches with SRAM and DRAM. In a typical processor comprising one or more cores, each core comprises an execution unit with local or shared caches (as illustrated in FIG. 1A). The level '1' and level '2' caches are conventionally of the SRAM type (as illustrated in FIG. 1B) due to its high-speed characteristic. Soft errors in SRAM commonly arise from the alteration of the states of memory cell(s) hit by radiation particle(s). Standby leakage current through the two branches of stack PFET and NFET in each SRAM cell results in a significant amount of power consumption. FIG. 1C utilizes a DRAM cache with a conventional refresh engine. Error detection circuits are commonly employed to detect single or double bit errors in such caches to improve data integrity. Some caches also employ error correction circuits, mostly for correcting single bit errors.

Figure 3A:
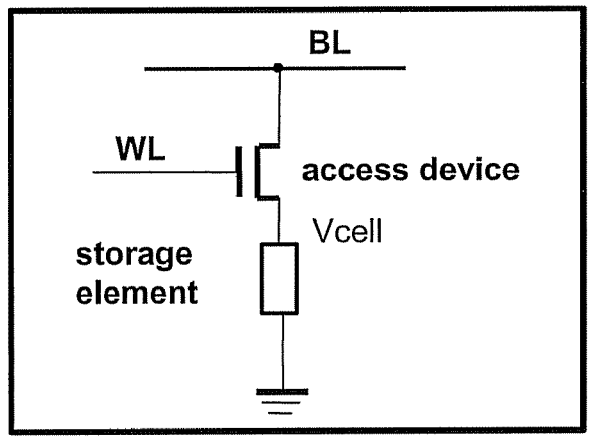
FIGS. 3A-3C illustrate conventional examples of DRAM cells.
Figure 3B:
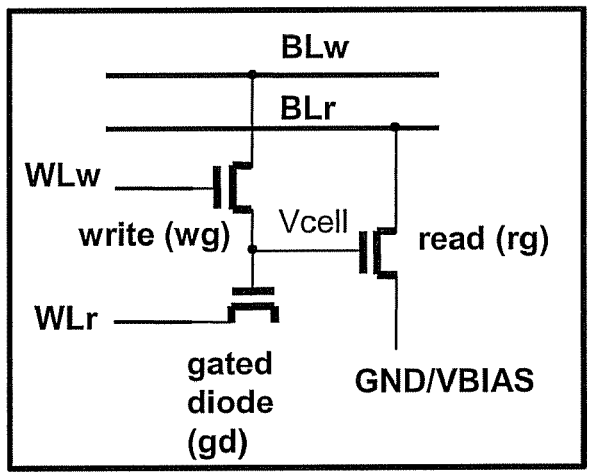
Figure 3C:
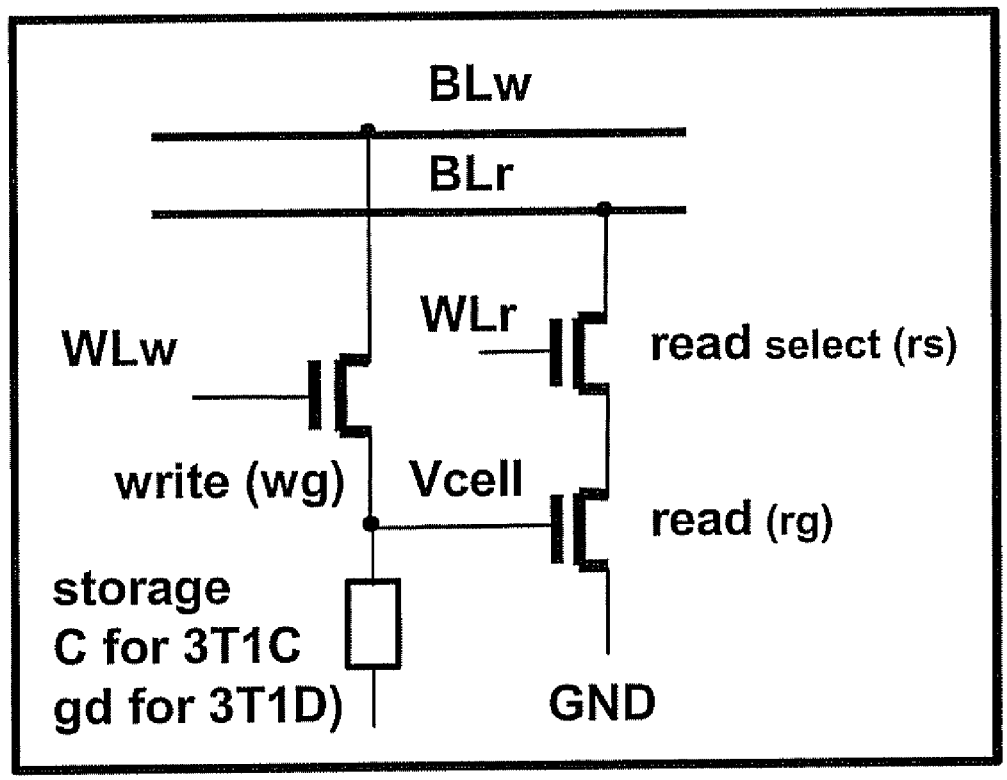

Referring to FIGS. 3A-3C there is illustrated examples of DRAM cells. As illustrated in FIGS. 3A-3C, typical DRAM cells comprise an access transistor or write transistor and a storage element such as a capacitor. FIG. 3A illustrates a typical one transistor and one capacitor (1T1C) cell.

With the advent of high speed DRAM using cells such as the two transistors and one gated diode (2T1D) cell, or the three transistors and one gated diode (3T1D) cells, shown in FIGS. 3B and 3C respectively, DRAMs are able to match SRAMs in speed (both cycle time and latency) and in their tolerance to process variability. As a result, high speed caches based on DRAM are becoming candidates for replacing SRAM in low level (levels '1' and '2') embedded caches of processor cores for future generations of process technology.

Figure 4A:
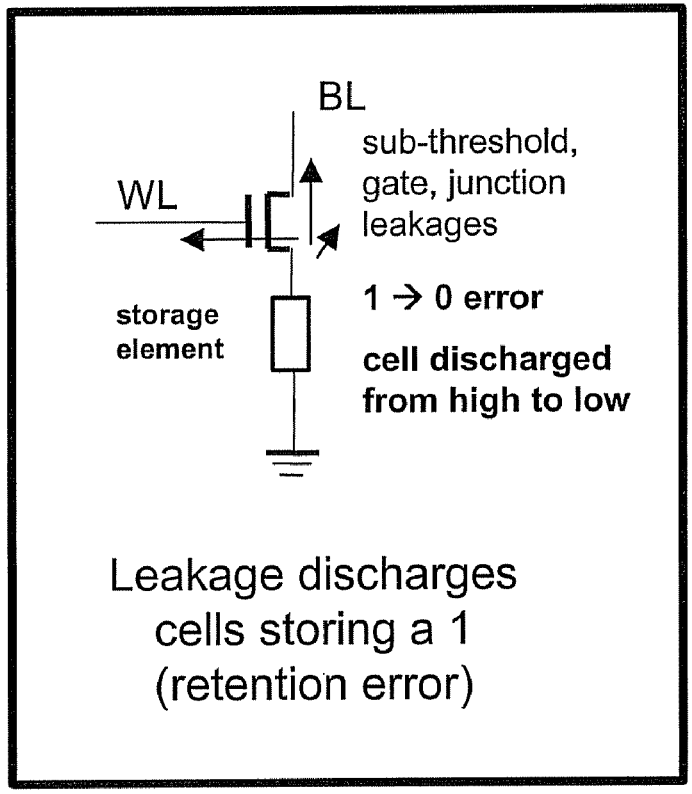
FIGS. 4A-4B illustrate examples of DRAM cell errors.
Figure 4B:
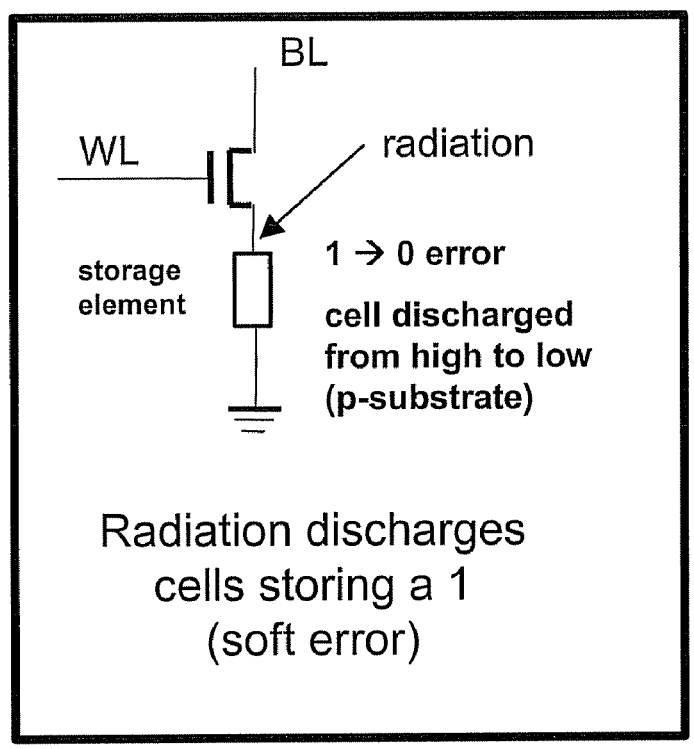

Referring to FIGS. 4A-4B there is illustrated examples of DRAM cell errors. One major remaining hurdle for implementing DRAM caches is the efficient refreshing of data due to leakage from the sub-threshold leakage and the junction leakage of the access transistor, and the gate leakage of the transistors connected to the storage element, as illustrated in FIG. 4A. An error due to leakage, commonly called retention error, manifests itself when the high voltage (e.g. representing '1'-data) stored in the storage element decays over time to a lower voltage, and interpreted as '0'-data during a read operation. A conventional refresh scheme simply refreshes the data at time intervals determined by the retention time specification using a refresh engine (as illustrated in FIG. 1C). Such refresh operations consume a significant amount of power, and constitute wasted power if the data being refreshed is never accessed again as is often the case.

Figure 8:
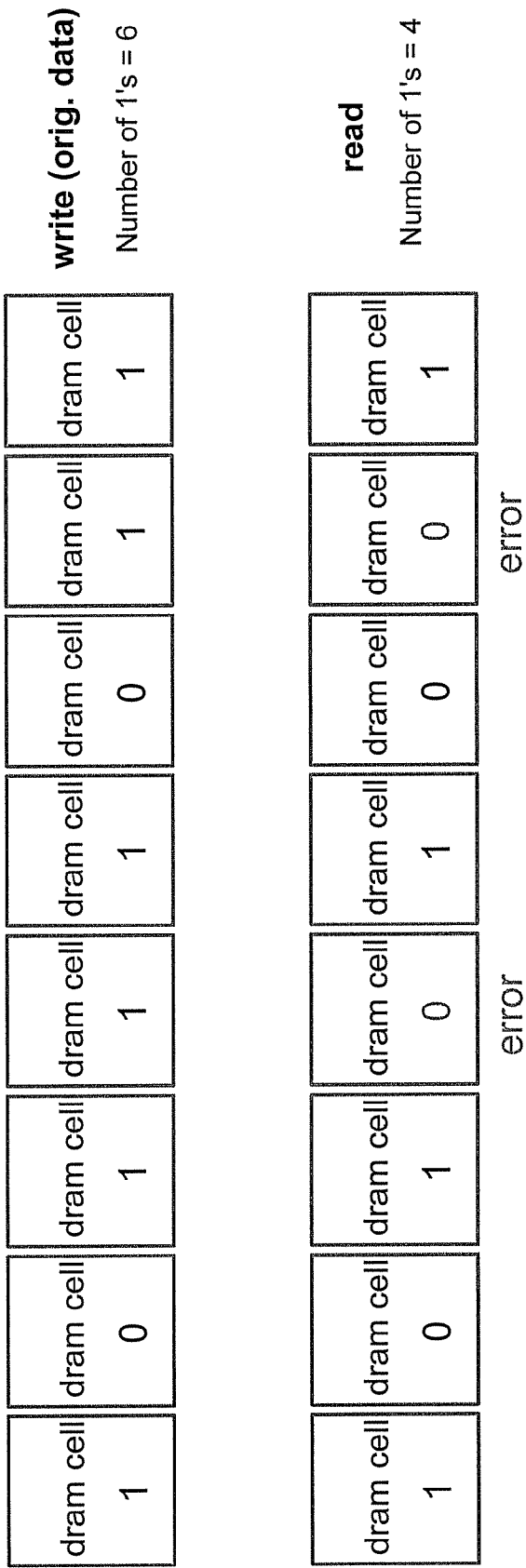
FIG. 8 illustrates one example of DRAM error condition (some stored 1's become 0's)

Another type of error, called soft error, occurs when the storage node and its associated substrate are hit by high-speed particles from a radiation source, discharging the high voltage stored in the storage element typically implemented in p-substrate silicon (as illustrated in FIG. 4B). Thus, both types of errors, due to retention or radiation, lead to a high stored voltage in the storage element being discharged to a sufficiently low voltage, resulting only in '1' to '0' errors. Such errors in a single direction allow the use of simple unidirectional or asymmetric error detection codes (or simply error codes) for detecting multi-bit errors in a given addressable word of the DRAM array, as illustrated in FIG. 8.

For complementary cell logic and n-substrate cells, only 'O' to '1' errors may occur, and under such situation, the techniques described in the current invention can be extended and applied accordingly.

An exemplary embodiment of the present invention describes a novel DRAM cache structure, the associated circuits and method of operations for high speed, low level caches that does not require regular refresh operations, hence eliminating refresh power, refresh overhead and potentially avoiding read/write stalls due to refresh for low level caches. Various error detection schemes for multi-bit data errors in the DRAM cache are also.

Referring to FIG. 1C there is illustrated one example of a typical DRAM cache with a refresh engine connected to an execution unit. Data in the DRAM cache is regularly refreshed at some interval to maintain data integrity. The conventional DRAM cache with refresh engine can be used for higher level, such as level '3' (L3) caches.

A faster DRAM cache (such as that based on the faster 2T/3T gated diode technology) with the present on-demand reload scheme can be targeted for lower level cache applications such as level '1' cache.

Figure 2:
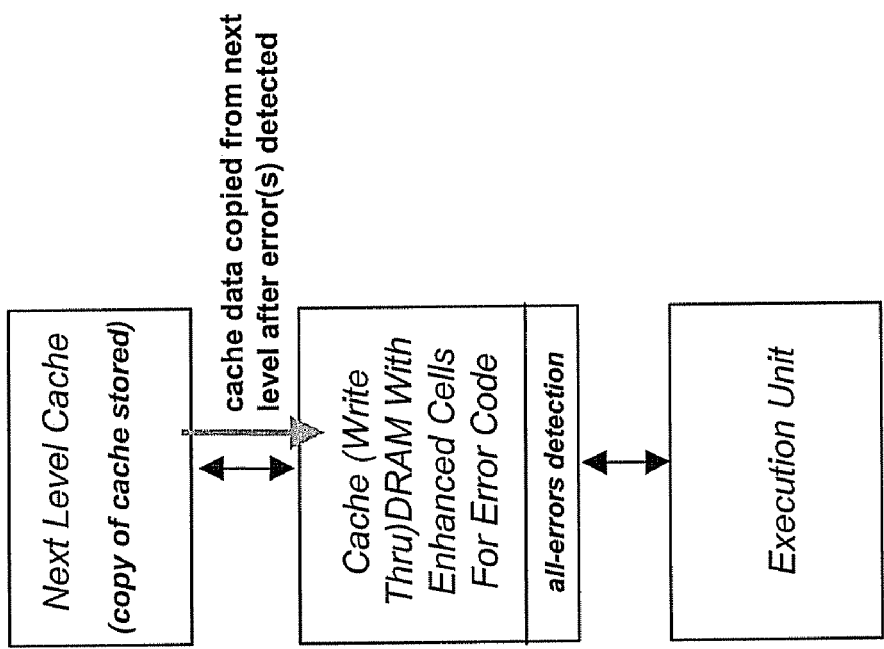
FIG. 2 illustrates one example of DRAM cache with on-demand reload.

Referring to FIG. 2 there is illustrated one example of a refreshless DRAM cache structure (such as level '1') connected to an execution unit. The data in the DRAM cache does not require refresh. A copy of the cache data or an encoded copy of the cache data or its derivative is available in the next level cache. An example of this class of caches is a write-through cache. Data integrity or correctness is maintained by creating and storing an error code during write operations and recreating the error code and comparing with the stored error code during read operations. Unlike in an SRAM, power is not consumed to maintain the data. The data is allowed to decay through inherent leakage, or to be corrupted due to radiation. If errors are detected during read, a copy of the data from the next level cache is reloaded into the cache. This data may be simultaneously sent to the execution unit if it is waiting for the return of the data. Access to the cache is not subject to refresh stalls as there is no refresh operation. Correct data is returned to the execution, either directly from the cache (e.g. level '1'), or, if an error was detected, from the higher level caches. Using fast error generation and detection circuits, and with proper scheduling and buffering of read and write operations, the performance of such a DRAM cache can approach that of an SRAM cache.

Figure 5:
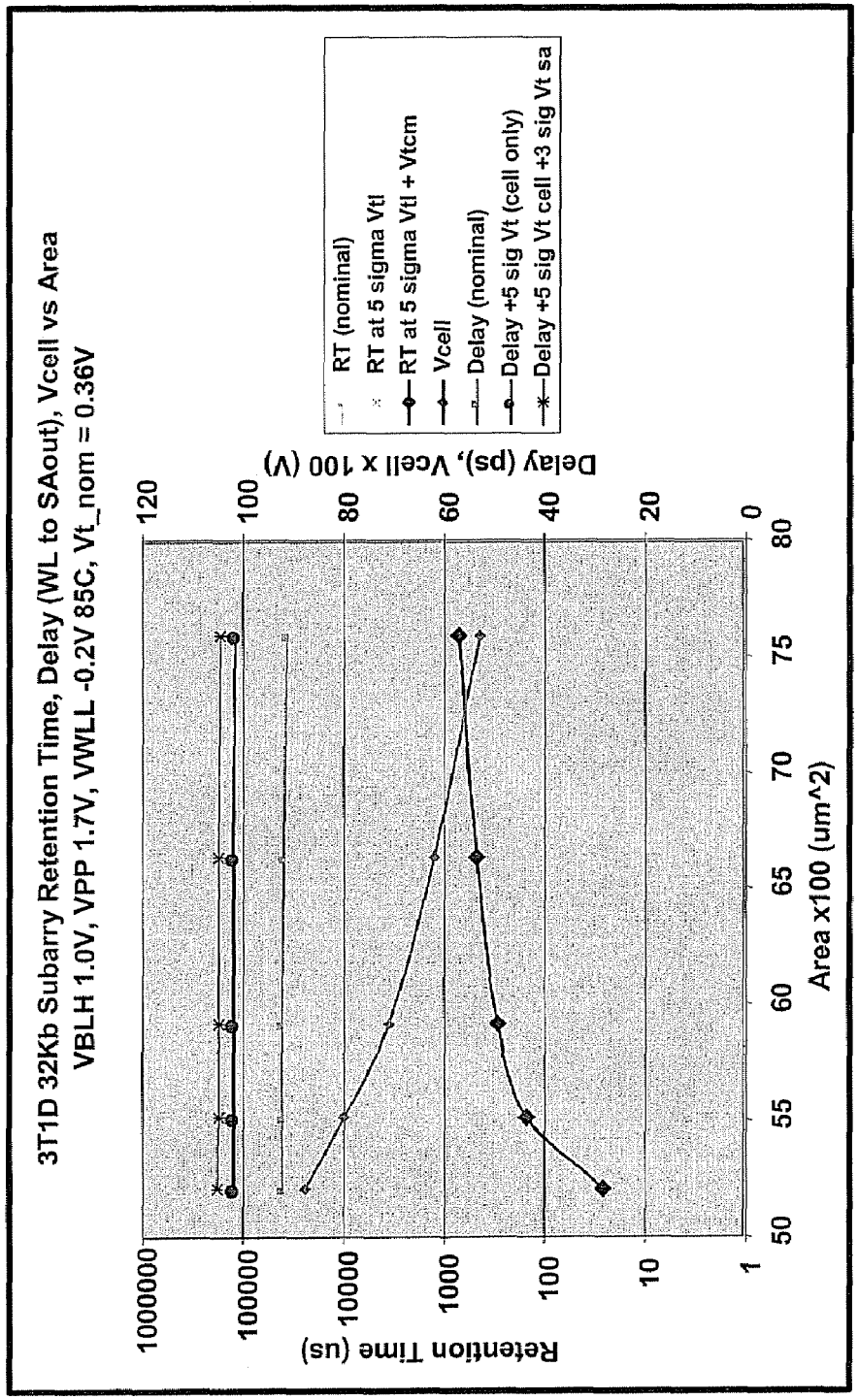
FIG. 5 illustrates one example of a three transistors and one gated diode (3T1D) DRAM cell characteristics.

Referring to FIG. 5 there is illustrated the delay, retention and area characteristics of a typical 3T1D DRAM cache. By careful design, a smaller delay as well as a smaller area compared to SRAM cache can be achieved in such a 3T1D DRAM cache. As shown in the exemplary characteristics, delay (from wordline to sense amplifier output) is 100 ps with a retention time of 100 us.

Figure 6:
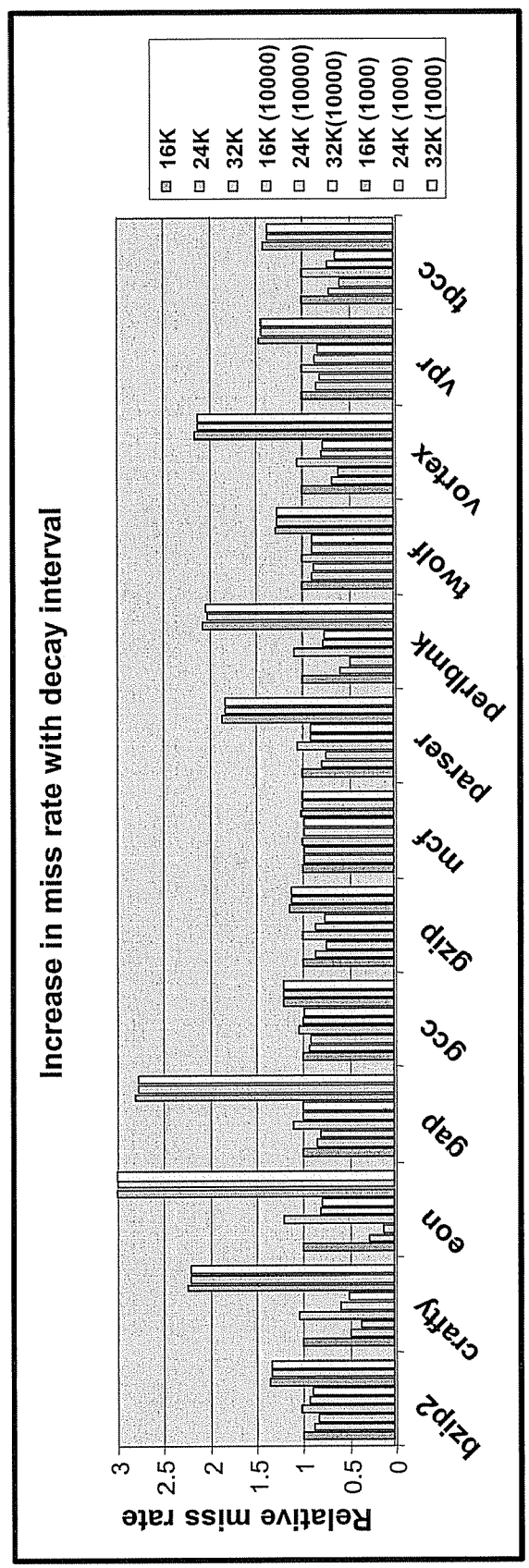
FIG. 6 illustrates one example of relative miss rate of level '1' cache verse data retention and cache size for (typical benchmark) programs.
Figure 7A:
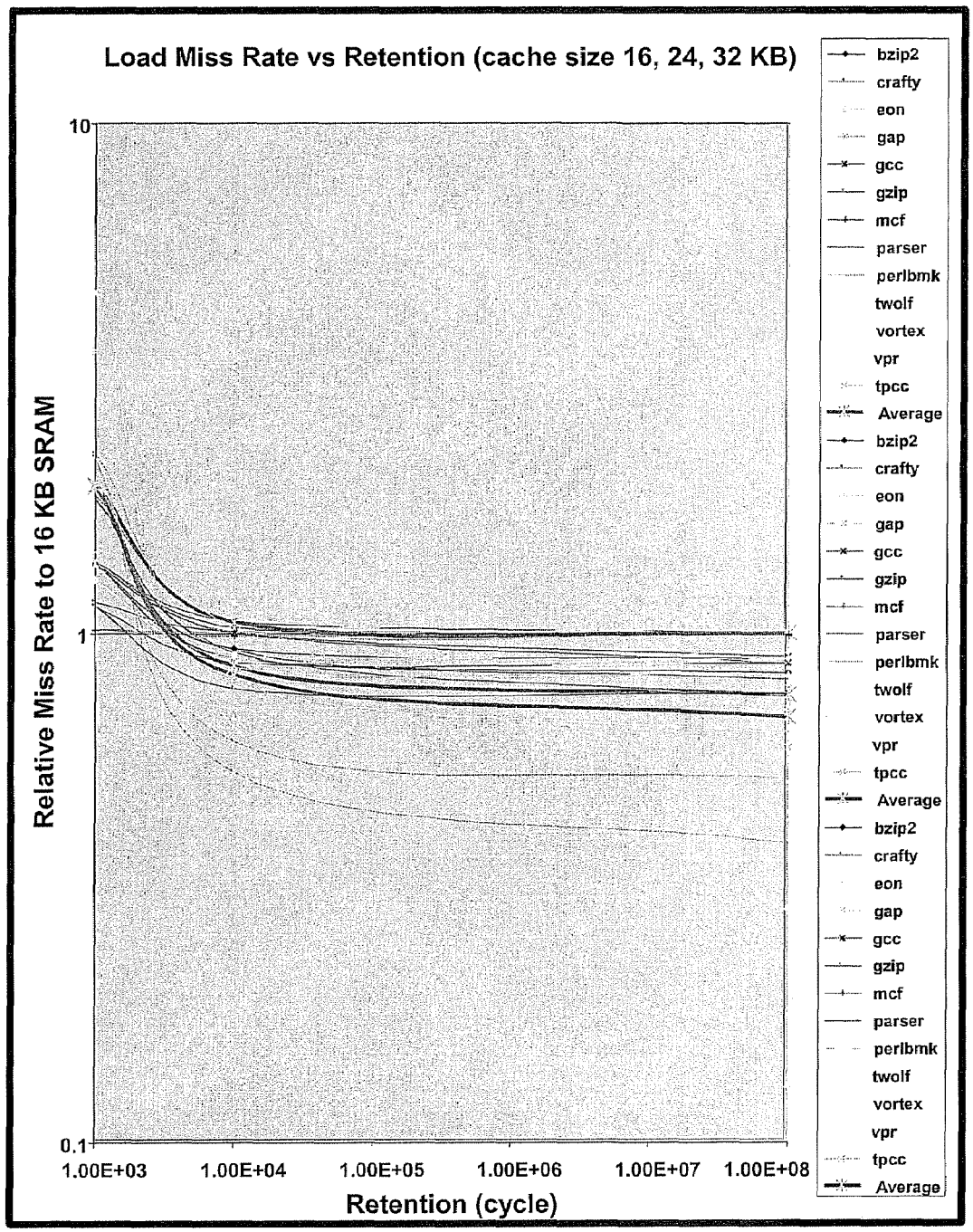
FIGS. 7A-7C illustrate examples of relative miss rate of level '1' cache verse data retention and cache size for programs under various load, store, load+store operations respectively.
Figure 7B:
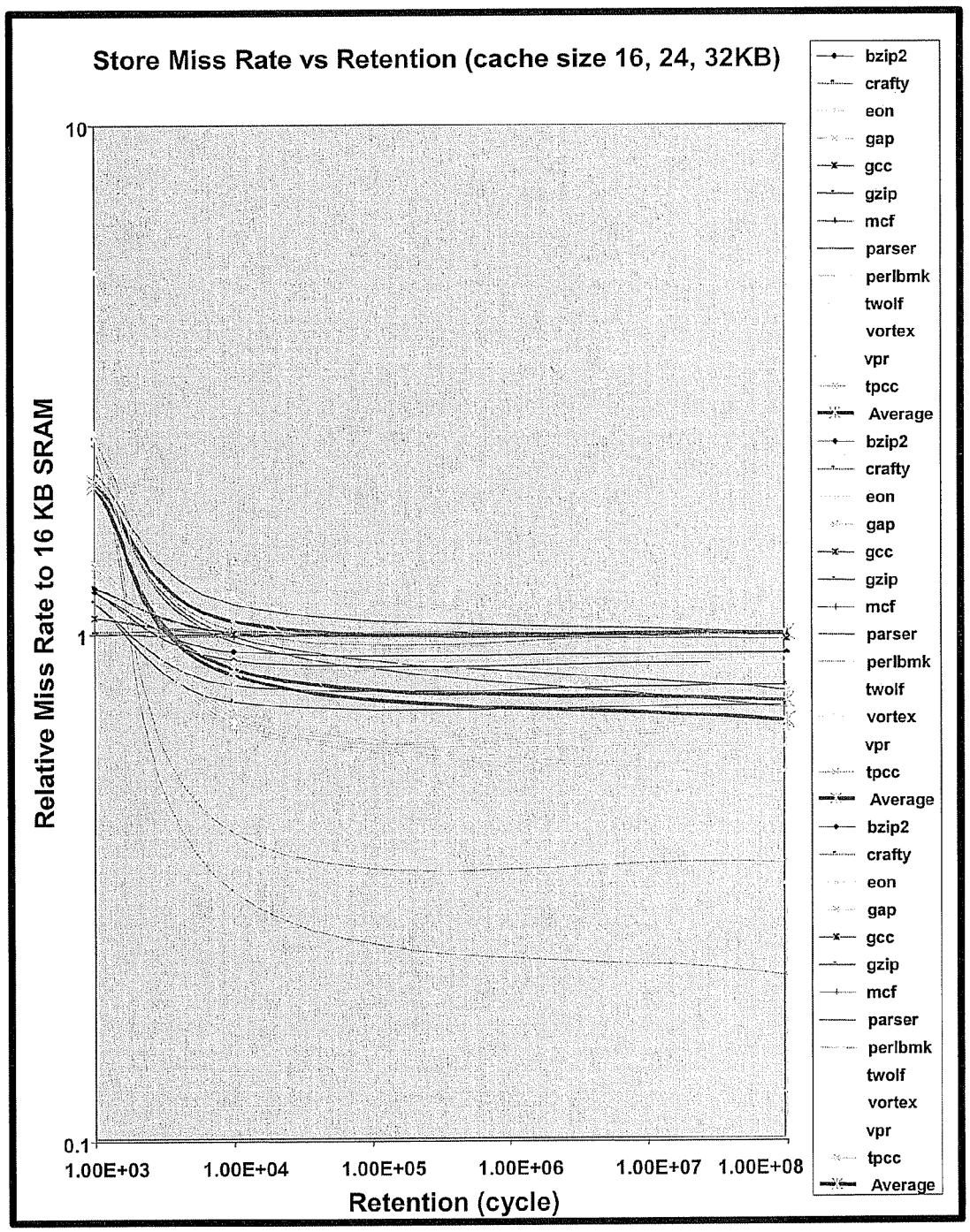
Figure 7C:
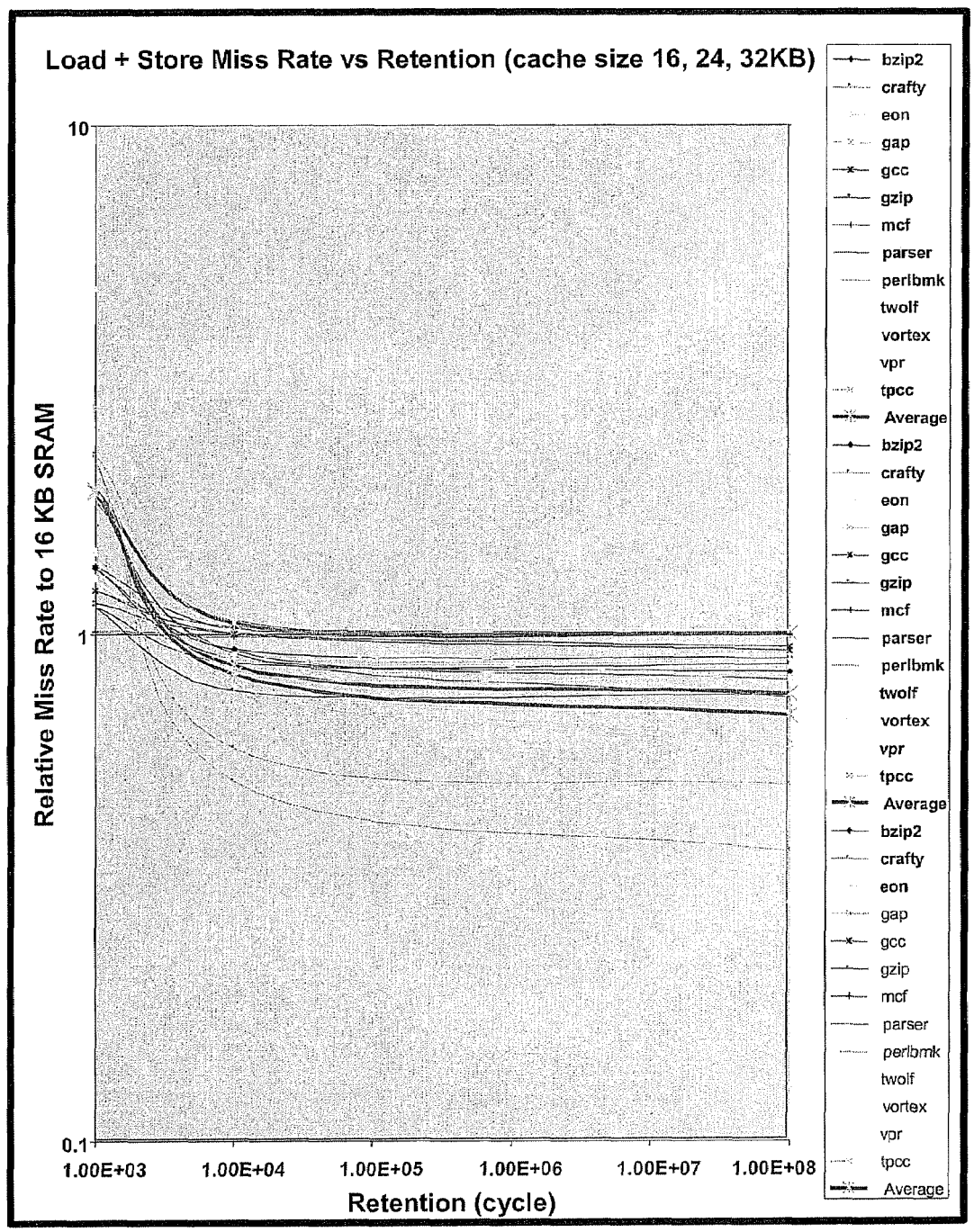

Based on the temporal behavior of data in level '1' data caches for various types of (benchmark) codes (illustrated in FIG. 6), in a high percent of cases, it does not hurt if the data in the level '1' data cache does not reside in the cache beyond a certain number of processor cycles. The graph shows that, for a given cache size, there is no significant increase in miss rate when data are forced out of the cache if they have been resident for more than 10000 cycles. On the other hand there is an appreciable increase in the miss rate if they are forced out within 1000 cycles. Referring to FIG. 7A-7C there are illustrated graphs of the variation of load, store and load+store miss rates for various values of retention time and for various cache sizes. For a given cache size (16 KB), when the retention is down to $10^3$ cycles, the miss rate is relative large compared to that of SRAM (>$10^8$ cycle), and hence performance suffers. But when the retention time is larger than $10^4$ cycles, the miss rates for the various benchmark are not significantly worse compared to those for an SRAM. This confirms the temporal nature of data in level '1' cache. We also see from the graphs that the miss rate for a given retention time is smaller as the size of the cache increases (smaller cell size in the same area).

For a typical execution unit cycle time of 200 ps (5 GHz clock frequency), $10^4$ cycles translates into 2 us retention time, which is well under the typical retention time of 100 us shown earlier. These numbers indicate that either the data in the caches are accessed frequently, or they get cast out due to the finite cache size.

FIG. 8 shows how errors in the stored DRAM data can be detected. The original 8-bit data 10111011 written to the DRAM has six 1's. Due to two '1' to '0' errors (due to either leakage or radiation), the 8-bit data becomes 10101001 with only four 1's. The error code used is basically derived from the number of 1's in the data. Such a code can be computed for example by a counter that counts the number of 1's for a given number of bits. When data is written to the DRAM, the computed code (denoted by number_of_1_write) is stored in the check-bit memory; and when that data is read from the DRAM, the code is recomputed (denoted by number_of_1_read) and compared with number_of_1_write stored in the check-bit memory. During read, if number_of_1_read is not equal to number_of_1_write, an error condition is generated for that data. In this example, number_of_1_write=6 and number_of_1_read=4, indicating an error.

Figure 9A:
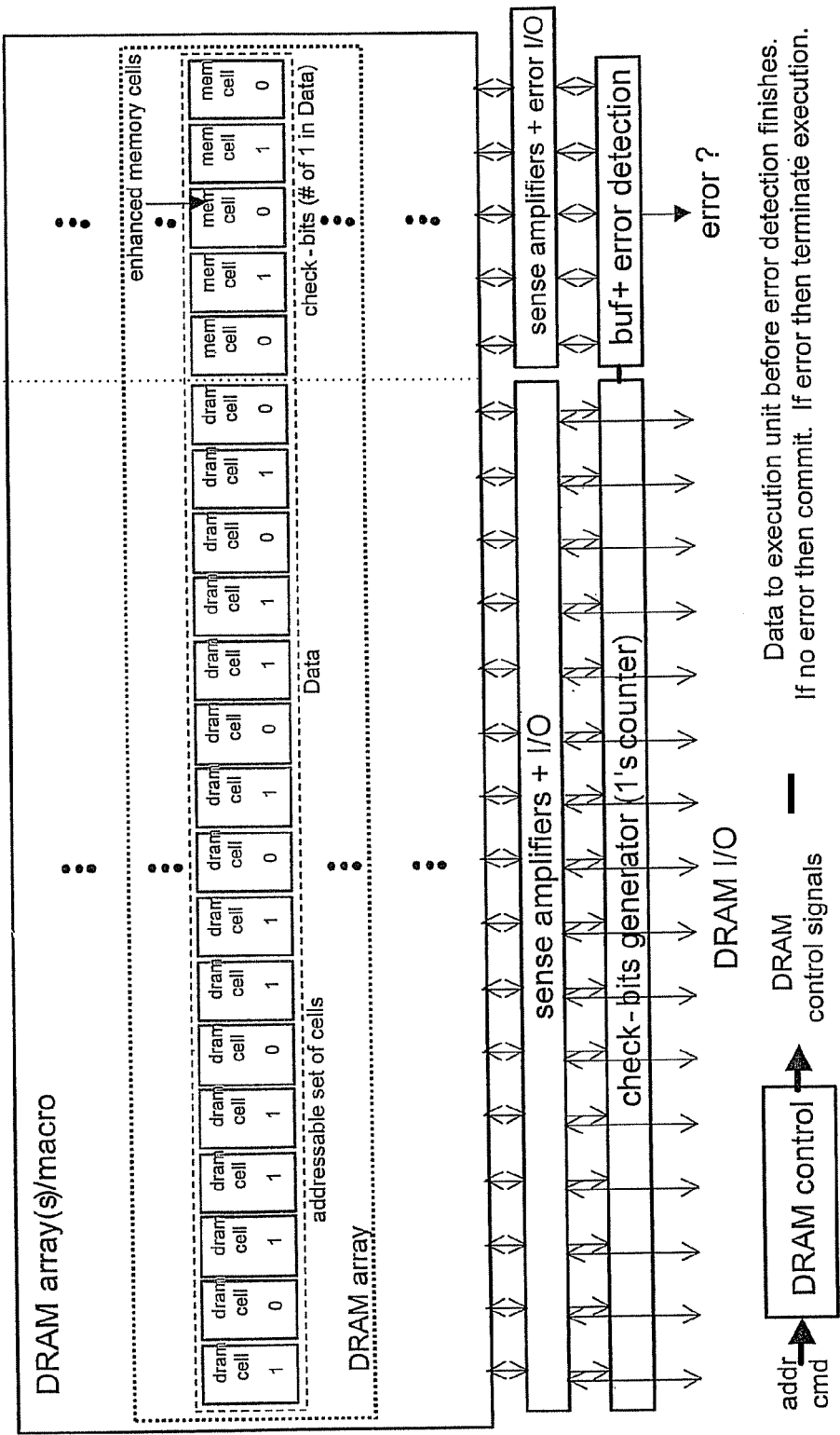
FIG. 9A illustrates one example of DRAM cache with on-demand reload using the multi-bit error code and error detection scheme using counters.

FIG. 9A illustrates one example of the overall DRAM cache array structure comprised of one or more DRAM arrays of DRAM cells, sense amplifiers and I/O for the data, the corresponding error check-bit memory cells, and the associated sense amplifiers and I/O for the check-bits. (The check-bit memory cells store the error code, and the term "check-bits" are herein used interchangeably with the term "error code".) Additionally, the array structure incorporates an error code generator (also called a check-bits generator) and an error detection circuit, as well as the usual DRAM control unit for decoding addresses and commands. The error code generator generates the check-bits for the input data during write as well as the check-bits during read. It is a fast circuit for counting the number of '1's in a set of addressable data bits (such as bits in a row). The minimum number of bits needed for the check-bits is ($\log_2$ N+1) where N is the number of addressable data bits. For example, as illustrated, when the number of addressable data bits is 16, the number of check-bits is ($\log_2$ 16+1)=5. Since there are ten 1's in the data, the derived error code can be 01010, which is the binary representation of the number 10. During the write of data into the DRAM cache array via the I/O, check-bits are also generated and written to the check-bits portion of the array. During the read of data from the DRAM cache array, check-bits are generated after the read out from the sense amplifiers and compared in the error detection circuit with the check-bits stored at that address. To hide the delay of the count-1 circuit, data can be buffered and check-bits generated ahead of time by proper scheduling of write command and data. Similarly, during read, the read data can be passed to the execution unit before the completion of error detection. If an error is detected, then the execution unit ignores the data, and waits for the correct data.

Figure 9B:
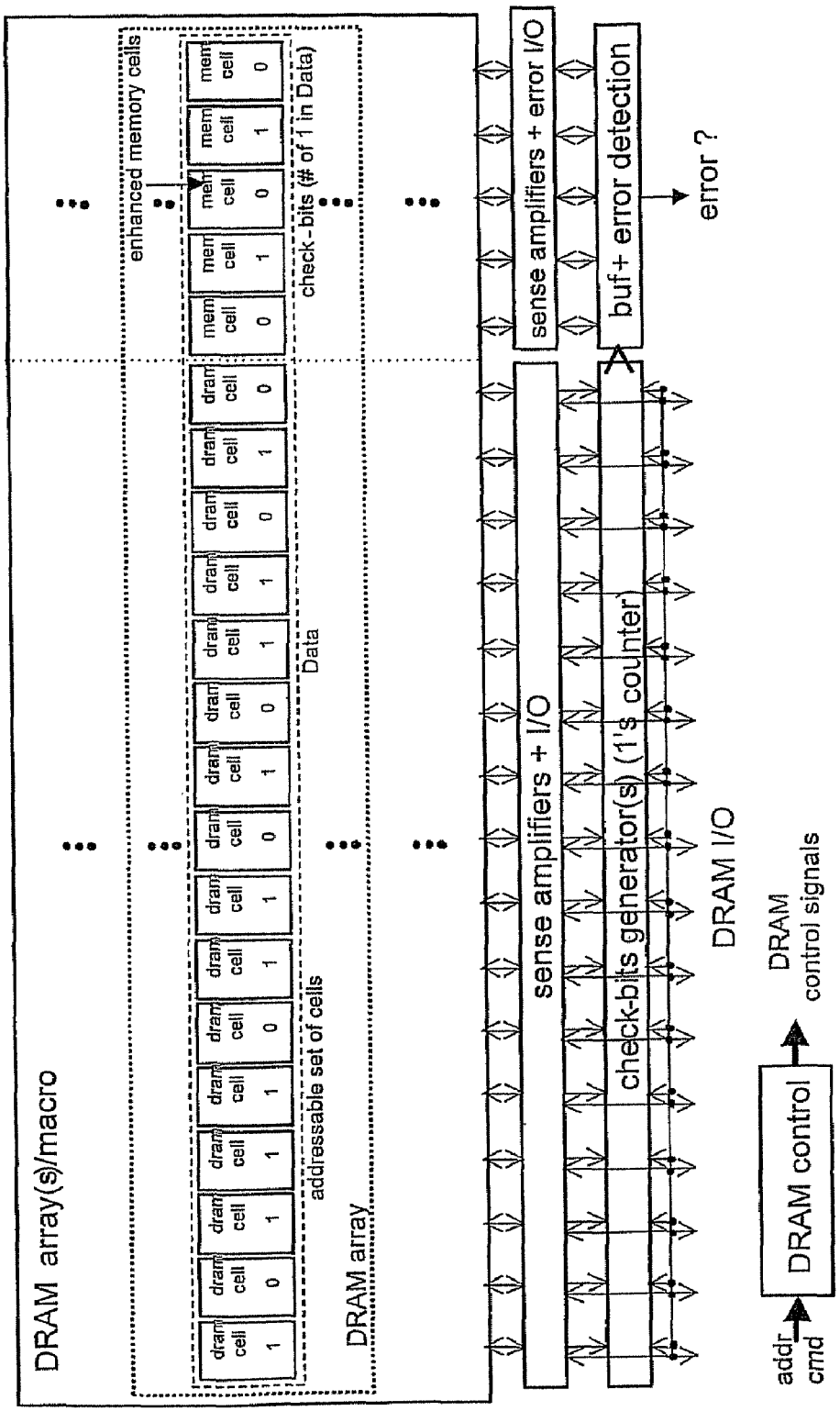
FIG. 9B illustrates an alternative of the embodiment where the check-bit generator can be shared between the read and write datapaths, or separate check-bit generators can be used for read and write.
Figure 9C:
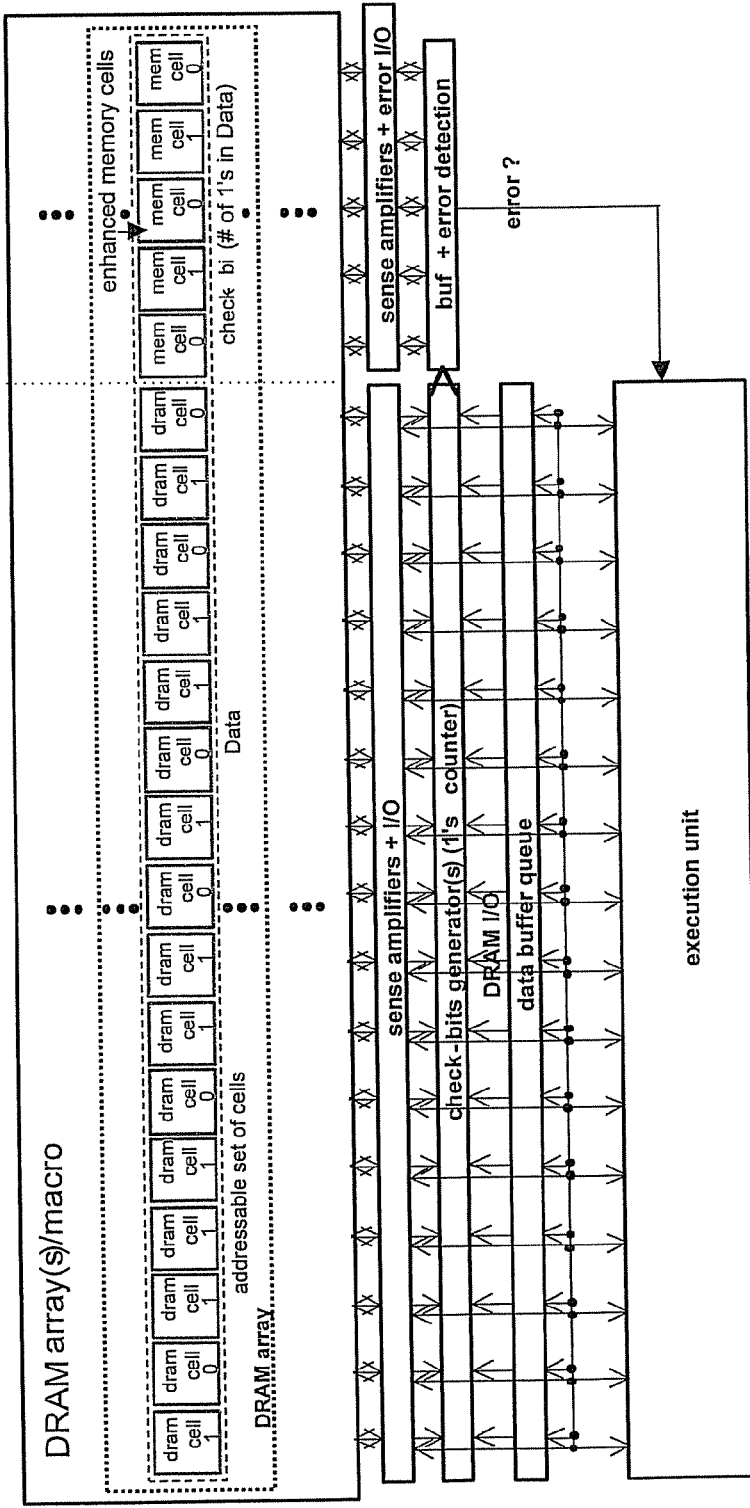
FIG. 9C illustrates another alternative of the embodiment where the check-bits can be generated ahead when data is available early (from an execution unit) before writing into the memory to reduce writing time overhead.

As described earlier, FIG. 9A illustrates one example of DRAM cache with on-demand reload using the multi-bit error detection scheme using counters. FIG. 9B illustrates an alternative of the embodiment where the error code generator can be shared between the read and write data-paths. Alternatively, separate check-bit generators can be used for read and write. FIG. 9C illustrates another alternative of the embodiment in which the check-bits are generated early when data is available from an execution unit before the address.

Enhanced memory cells such as radiation hardened, less leaky DRAM cells or static memory cells can be used for the check-bit memory. Additionally the check-bits may be stored either in true form or in complementary form. For error detection using the check-bits stored in complementary form, the check-bits are inverted first before comparing with the check-bits of the read data. Less leaky DRAM cells or the same type of DRAM cells as that for the data can also be used for storing the check-bits in complementary form. When DRAM cells are used for storing the check-bits, unidirectional errors can occur in both the data and the check-bits in a way that masks the existence of an error. For this reason, the check-bits should be stored in complementary form. When an error occurs, the binary representation of the number of 1's in the data would then always be less than the complement of the value shown by the check bits. But there is still the possibility of false errors being generated due to defects in the check-bit memory cells rather than defects in the data memory cells. However, such false errors simply cause a reload and do not affect the functioning of the system other than the consumption of resources and time to handle the error exceptions, resulting in system performance degradation.

Figure 10:
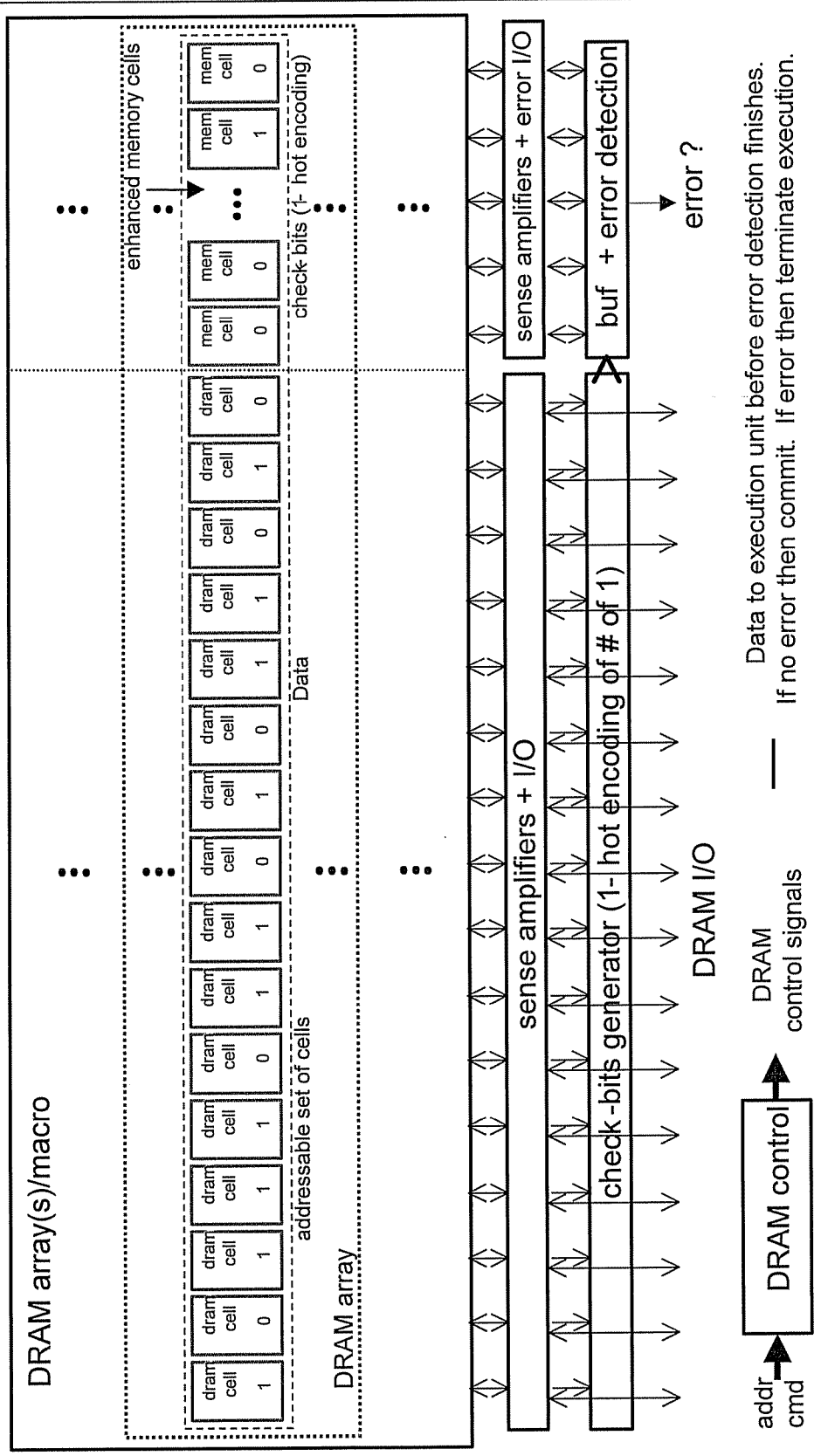
FIG. 10 illustrates one example of DRAM cache with on-demand reload using the multi-bit error code and error detection scheme using 1-hot encoding.

Referring to FIG. 10 there is illustrated another embodiment of the DRAM cache array structure using a 1-hot encoding scheme for deriving the error code. In a 1-hot encoding code there is only a single '1' in one of the N+1 buckets, with the position of the 1 representing the number of 1's in the addressable data bits. DRAM cells can be used to store the 1-hot encoding as any error in the check-bits results in the check-bits being all zeroes, an illegal value in 1-hot encoding.

Figure 11:
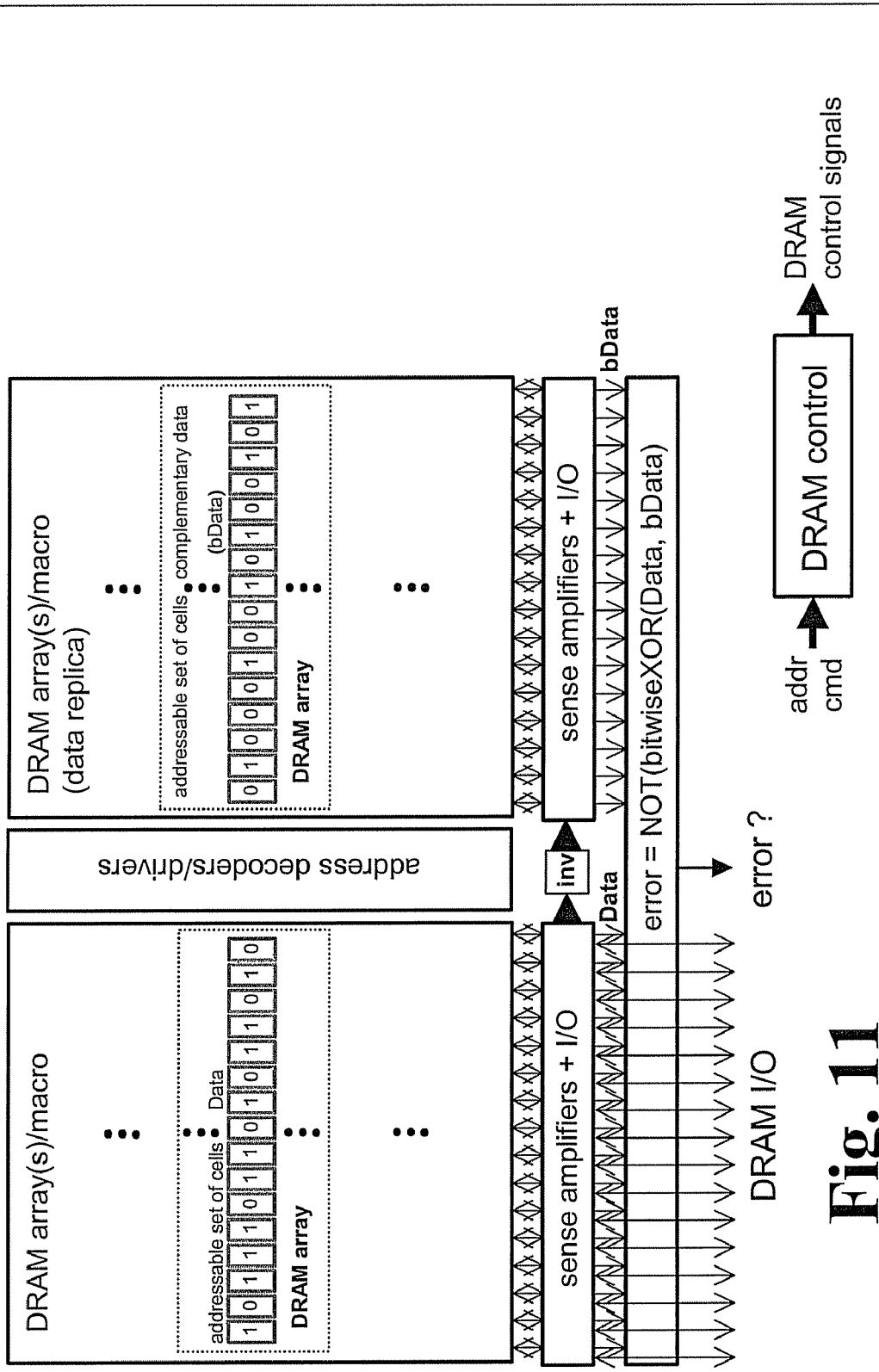
FIG. 11 illustrates one example of DRAM cache with on-demand reload using data replica.

Referring to FIG. 11 there is illustrated another embodiment of the DRAM cache array structure using a redundancy array. The complementary data is stored for each bit of the original data, by inverting each bit during write from the I/O. For unidirectional '1' to '0' errors, at most one error can occur per bit. It is not possible for both the original data bit and the (inverted) complement data bit to be wrong at the same time. Therefore any error can be detected easily during read out by performing an exclusive-or (XOR) of the data bit with the complementary data bit, with a result of '1' indicating the absence of error. So for all the bits read, the XOR vector of bits should be all 1's if there is no error; and at least one bit of the XOR vector would be a '0' if there is an error. This structure requires twice the number of data bits, sense amplifiers and I/O as the original scheme. However, the address decoders and drivers can be shared (though made larger) between the original data bits and the redundancy data bits.

Figure 12:
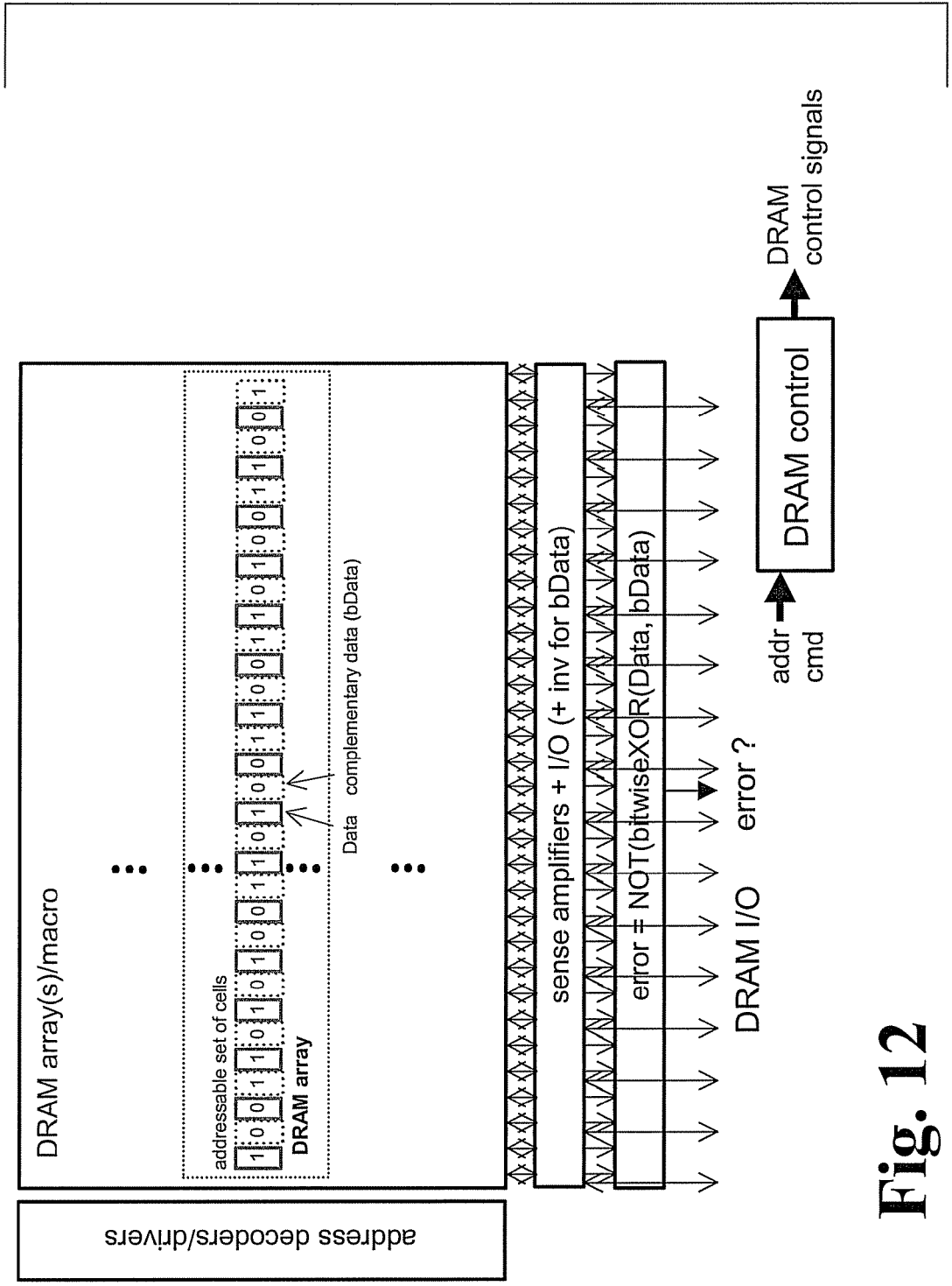
FIG. 12 illustrates one example of DRAM cache with on-demand reload using data replica.

Referring to FIG. 12 there is illustrated another embodiment of the DRAM cache array structure of FIG. 11, that interleaves the data bit and complementary data bit next to each other. In essence, two bits are used to store one bit of data in the same location in an array. Since both bits are addressed at the same time, for certain memory cells, some circuit simplifications and reduction of device count may be possible, e.g. footer devices may be combined between the bits in a 2T1D memory cell implementation. The wordline length in this structure may be longer compared to the separate array structure shown in FIG. 11.

Referring to FIGS. 13A and 13B there is illustrated an error detection and correction scheme to improve DRAM chip yield. For a manufactured wafer with DRAM chips and/or DRAM arrays, a certain number of DRAM chips or arrays will fail retention tests because there are some memory cells that will not meet the retention time specification due to manufacturing defects, leaky devices and process variability. Too many failure cells (exceeding the number of built-in redundancy cells) will make redundancy repair impossible and will cause the rejection of those chips or arrays. By incorporating the error code generation, the multi-bit error detection and the multi-bit error correction schemes, and the on-demand reloading (of data from a higher level memory), it is no longer necessary to reject those defective DRAM chips or arrays that were rejected under the conventional retention testing requirement. Retention hardware failure of those chips or arrays is detected exactly as a "soft" errors using the above error detection schemes, and corrected by reloading similar to a "soft" error, thereby simplifying chip testing, increasing yield and increasing redundancy coverage.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A DRAM cache with on-demand reload, said DRAM cache comprising:
   a plurality of DRAM arrays, each of said plurality of DRAM arrays further comprising a plurality of DRAM cells;
   a plurality of sense amplifiers;
   an input output structure used for a plurality of data; and
   a plurality of enhanced memory cells utilized as error check bits, for associated said plurality of sense amplifiers, for said input output structure.

2. A DRAM cache in accordance with claim 1, wherein:
   the enhanced memory cell is a radiation hardened static memory cell.

3. A DRAM cache in accordance with claim 1, wherein:
   the enhanced memory cell is a retention enhanced dynamic memory cell.

4. A DRAM cache in accordance with claim 1, wherein:
   the enhanced memory cell is a retention enhanced (or less leaky) dynamic memory cell with check bits in complement form.

5. A DRAM cache in accordance with claim 1, further comprising:
   a plurality of check bit generators, said check bit generator generates a plurality of check bits for input data during write and for check bits during read.

6. A DRAM cache in accordance with claim 5, further comprising:
   an error detection circuit.

7. A DRAM cache in accordance with claim 6, further comprising:
   a DRAM control unit for address and command decode.

8. A DRAM cache in accordance with claim 7, wherein a number of zeros in a set of addressable data bits during a read or write operation is computed.

9. A DRAM cache in accordance with claim 7, wherein a number of ones in a set of addressable data bits during a read or write operation is computed.

10. A DRAM cache in accordance with claim 9, wherein 'N' is the number of said set of addressable data bits.

11. A DRAM cache in accordance with claim 10, wherein said number of bits, for said plurality of check bits, is at least $\log_2$ 'N'+1.

12. A DRAM cache in accordance with claim 11, wherein during read operation said plurality of check bits is generated after the read from said plurality of sense amplifiers and then compared with stored check bits in said error detection circuit.

13. A DRAM cache in accordance with claim 12, wherein a plurality of error check bits are represented as 1-hot encoding code where there is a '1' in exactly one of the N+1 buckets, its position representing how many ones are in a plurality of addressable data bits.

14. A DRAM cache in accordance with claim 13, further comprising:
   a redundancy array for each bit of said plurality of data.

15. A DRAM cache with on-demand reload, said DRAM cache comprising:
   a plurality of DRAM arrays, each of said plurality of DRAM arrays further comprising a plurality of DRAM cells;
   a plurality of sense amplifiers;
   an input output structure used for a plurality of data; and
   a redundancy memory array for each bit of said plurality of data utilized as error check bits, for associated said plurality of sense amplifiers, for said input output structure.

16. A DRAM cache with on-demand reload, said DRAM cache comprising:
   a plurality of DRAM arrays, each of said plurality of DRAM arrays further comprising a plurality of DRAM cells;
   a plurality of sense amplifiers;
   an input output structure used for a plurality of data; and
   a redundancy memory cell for each bit of said plurality of data utilized as error check bits, for associated said plurality of sense amplifiers, for said input output structure.

17. A DRAM cache in accordance with claim 16, wherein said redundancy memory cell stores said bit of data in complement form.

* * * * *